United States Patent
Kuo et al.

(10) Patent No.: US 8,421,652 B2
(45) Date of Patent: Apr. 16, 2013

(54) DECODING CIRCUIT AND DECODING METHOD THEREOF

(75) Inventors: Chun-Ting Kuo, Pingtung County (TW); Chun-Fu Lin, Taoyuan County (TW); Cheng-Han Hsieh, Hsinchu County (TW)

(73) Assignee: MY-Semi Inc., Hsinchu County (TW)

( * ) Notice: Subject to any disclaimer, the term of this patent is extended or adjusted under 35 U.S.C. 154(b) by 379 days.

(21) Appl. No.: 12/915,068

(22) Filed: Oct. 29, 2010

(65) Prior Publication Data

US 2011/0121748 A1    May 26, 2011

(30) Foreign Application Priority Data

Nov. 26, 2009  (TW) ................................ 98140368 A

(51) Int. Cl.
*H03M 5/08*    (2006.01)
(52) U.S. Cl.
USPC .................................. 341/53; 341/50; 341/51
(58) Field of Classification Search ............ 341/50–107; 375/354, 376; 315/291
See application file for complete search history.

(56) References Cited

U.S. PATENT DOCUMENTS

| | | | |
|---|---|---|---|
| 6,768,433 B1* | 7/2004 | Toth et al. | 341/105 |
| 6,904,539 B2* | 6/2005 | Ueno | 713/500 |
| 7,598,684 B2* | 10/2009 | Lys et al. | 315/307 |
| 2011/0109228 A1* | 5/2011 | Shimomura et al. | 315/113 |

FOREIGN PATENT DOCUMENTS

EP    2107860    *  7/2009

* cited by examiner

*Primary Examiner* — Jean B Jeanglaude
(74) *Attorney, Agent, or Firm* — Jianq Chyun IP Office

(57) ABSTRACT

A decoding circuit is adapted for decoding an input signal. The input signal includes at least a break and the time length of the break is a preset time. The decoding circuit includes a decoding unit and a detecting unit. The detecting unit detects whether the voltage level of the input signal is kept at a specific logic level for more than the preset time. If the input signal is kept at the specific logic level for more than the preset time, the detecting circuit, according to the voltage level of the specific logic level, outputs the input signal or the inverted input signal to the decoding unit so as to perform a decoding process.

11 Claims, 3 Drawing Sheets

DECODING CIRCUIT AND DECODING METHOD THEREOF

CROSS-REFERENCE TO RELATED APPLICATION

This application claims the priority benefit of Taiwan application serial no. 98140368, filed on Nov. 26, 2009. The entirety of the above-mentioned patent application is hereby incorporated by reference herein and made a part of this specification.

BACKGROUND OF THE INVENTION

1. Field of the Invention

The invention relates to a decoding circuit and a decoding method thereof, and more particularly, to a decoding circuit of a DMX512 signal format and a decoding method thereof.

2. Description of Related Art

DMX512 protocol standard is a data transmission standard initially proposed by United States of Institutes for Theater Technology (USITT) in 1986, and is a commonly used control protocol in the field of entertainment lighting. The DMX512 communication technology applies an asynchronous communication format, where each lighting adjustment data is composed of 11 bits, including one bit representing a start time, 8 bits representing a data byte and two stopping bits, and 512 lighting adjustment data can be transmitted every time. Currently, stage light controls mostly use the DMX512 protocol standard to perform the stage light control.

In the DMX512 protocol standard, every transmitting data includes a break signal and a plurality of data signals, where the break signal is usually a logic low level for 88 microseconds($\mu$s). The break signal is a start signal of data, and a chip can determine a start of the signal by detecting the break signal. The break signal is followed by a plurality of time slots, and there is also a mark between every neighboring time slots as an interval, where the mark is a logic high level. When there is no DMX data packet generated, the signal is kept at the logic high level, and this is a mark after the last time slot. Therefore, there is usually a mark signal of the logic high level present before the break signal.

Nowadays, the driver circuit of light emitting diodes (LED) may also apply the DMX 512 signal format to transmit the driving data. In order to speed up the data transmission, transmission ways of 2 frequency multiplications (or two times the frequency of an standard DMX 512 protocol) or 4 frequency multiplications (or four times the frequency of an standard DMX 512 protocol) of the standard DMX512 signal format transmission rate are applied, mainly to shorten the standard time specification in the DMX512 signal format to ½ or ¼. Since the driver circuit of LED usually transfers the DMX512 signals in a serially connected fashion, if there are too many of the serially connected chips, the signal is easily made distorted, and the chip(s) serially connected thereafter thereby cannot correctly decode the data.

SUMMARY OF THE INVENTION

The invention provides a decoding circuit and a decoding method thereof which can correctly decode the input signal corresponding to the DMX512 signal format no matter the input signal is an in-phase signal or an inverted signal.

The invention proposes a decoding circuit, adapted for decoding an input signal. The input signal corresponds to the DMX512 signal format, and the input signal includes at least a break, where the length of the break is a preset time. The decoding circuit includes a decoding unit and a detecting unit. The detecting unit, coupled to the decoding unit, is configured for detecting whether the input signal is kept at a specific logic level for more than the preset time. When the input signal is kept at the specific logic level for more than the preset time, the detecting unit determines to output the input signal or the inverted input signal to the decoding unit to perform a decoding process.

In an embodiment of the invention, the detecting unit includes a multiplexer, an inverter and a level detecting unit. The multiplexer has a first input terminal, a second input terminal and a selecting terminal, and the first input terminal of the multiplexer receives the input signal. The inverter, coupled between the second input terminal and the input signal, is configured for inverting the input signal and outputting the inverted input signal to the second input terminal Besides, the level detecting unit, coupled to the selecting terminal of the multiplexer and the input signal, is configured for detecting whether the input signal is kept at the specific logic level for more than the preset time and controlling the multiplexer according to the voltage level of the specific logic level such that the multiplexer is made to output the input signal or the inverted input signal.

In an embodiment of the invention, when the specific logic level is a logic high level, the multiplexer outputs the received input signal to the decoding unit. On the contrary, when the specific logic level is a logic low level, the multiplexer outputs the inverted input signal to the decoding unit.

In an embodiment of the invention, the decoding unit is a DMX512 decoder.

In an embodiment of the invention, the input signal includes at least a mark, and the detecting unit detects whether a mark located before the break is over the preset time.

From another perspective, the invention proposes a decoding method, adapted for a decoding circuit to decode an input signal. The input signal corresponds to the DMX512 signal format, and the input signal includes at least a break, whose length is a preset time. The decoding method includes: firstly, receiving an input signal. Next, the input signal is detected whether being kept at a specific logic level for more than the preset time. When the input signal is kept at the specific logic level for more than the preset time, according to the voltage level of the specific logic level, the input signal or the inverted signal is output to a decoding unit in the decoding circuit to perform the decoding process.

In view of the above, the invention utilizes the detecting unit to detect the logic level of the input signal being high or low and a keeping duration of the logical level so as to determine a polarity of the input signal and determine whether to invert the input signal according to the determination result. Accordingly, no matter the input signal is the in-phase signal or the inverted signal, the decoding circuit can correctly decode the input signal.

In order to make the features and advantages of the invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings

DESCRIPTION OF EMBODIMENTS

Figure 1:
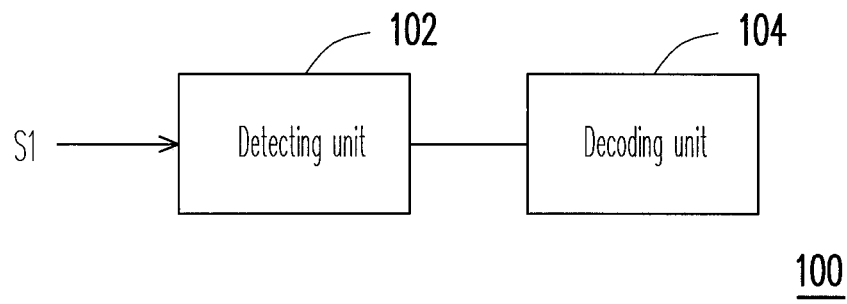
FIG. 1 is a block diagram of a decoding circuit according to a first embodiment of the invention.

Reference will now be made in detail to the present embodiments of the invention, examples of which are illustrated in the accompanying drawings. Wherever possible, the same reference numbers are used in the drawings and the description to refer to the same or like parts.

First Embodiment

FIG. 1 is a block diagram of a decoding circuit according to a first embodiment of the invention. Referring to FIG. 1, a decoding circuit 100 includes a detecting unit 102 and a decoding unit 104 coupled to the detecting unit 102. The decoding circuit 100 can be integrated into a driver chip of a LED and configured for decoding driving data of the DMX512 signal format. The driver chip controls variations of darkness and brightness of the LED according to the driving data so as to produce different illumination effects. The decoder unit 104 is, for example, a DMX512 decoder, and can be applied to detect the input signal corresponding to the DMX512 signal format, such as the DMX512 signal format of 2 frequency multiplications or the DMX512 signal format of 4 frequency multiplications. Since transferring signal in a serially connected system may induce the signal waveform distortion, therefore, during the transmission process, the input signal may be inverted and then transmitted to the next driver chip to prevent the problem of the waveform distortion.

Since the input signal is further output to the driver chip serially connected thereafter after being inverted, the phase of the signal received by an individual chip may be different, and could be an in-phase signal or an inverted signal. Therefore, before performing the decoding process, the phase of the received signal has to be detected, and then adjusted to be the in-phase signal, which is further output to the DMX decoder to perform the decoding process. Because there are a mark and a break in the DMX signal format, each data starts from the break (standard length is 88-176 μs), and when there is not data packet output, the signal is kept at a logic high level (i.e., the logic high level is the mark). Therefore, the input signal can be determined whether being the inverted input signal by detecting the voltage level of the mark in the input signal. The way of determining the mark can be determined by the keeping time of the voltage level, and as long as the time length thereof is over the time length of the break, it can be determined to be the mark. This is because that, in the DMX signal format, only the time length of the mark can be configured to be greater than the time length of the break. Accordingly, in the present embodiment, the detecting unit 102 determines whether the input signal is the inverted signal by utilizing the voltage level of the input signal.

Referring to FIG. 1, the detecting unit 102 detects whether the input signal S1 is kept at a specific logic level for more than the preset time after receiving the input signal S1 corresponding to the DMX512 signal format. When the input signal S1 is detected to be at the logic high level for more than the preset time, this means that the input signal S1 is the DMX512 signal in an in-phase format, and the detecting unit 102 may directly output the received input signal S1 to the decoding unit 104 to perform the decoding process. When the input signal S1 is detected to be at the logic low level for more than the preset time, this means that the input signal S1 is the DMX512 signal in an inverted format, and the detecting unit 102 may invert the received input signal S1 and then output the inverted input signal to the decoding unit 104 to perform the decoding process.

Since the input signal corresponds to the DMX512 signal format, there are breaks and the marks the data format. The preset time can be set according to the time length of an break in the input signal S1, for example, equal to or greater than the time length of the break. That is to say, the invention utilizes the logic level of the mark in the signal to determine the phase of the signal, when the mark of the logic high level is detected, it means that the signal is an in-phase signal; when the mark of the logic low level is detected, it means that the signal is an inverted signal. Since only the time length of the mark is more than the time length of the break in the DMX512 signal format, so the data bits in the signal do not affect the determination. The time length of the mark can be adjusted according to design requirements, and a standard length of a mark in the standard DMX512 signal format is 0-1 second.

Through the determination of the detecting unit 102, the input signal S1 with in-phase is directly input to the decoding unit 104, or the input signal S1 with inverted phase is adjusted to be the in-phase signal and then output to the decoding unit 104. Accordingly, the input signal S1 received by the decoding unit 104 can be ensured to be the in-phase signal, and the situation where the decoding unit 104 decodes the input signal S1 incorrectly can be avoided.

Figure 2:
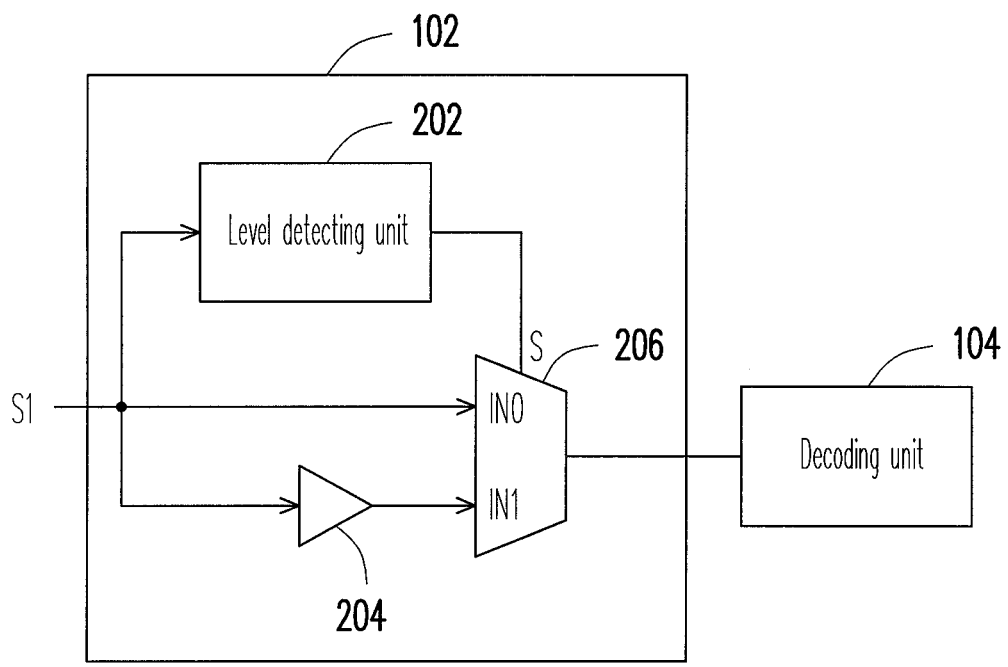
FIG. 2 is a block diagram of a decoding circuit according to a first embodiment of the invention.

Next, the circuit structure of the detecting unit 102 is further described referring to FIG. 2. FIG. 2 is a block diagram of a decoding circuit according to a first embodiment of the invention. Referring to FIG. 2, the detecting unit 102 includes a level detecting unit 202, an inverter 204 and a multiplexer 206. The multiplexer 206 has a first input terminal IN0, a second input terminal IN1 and a selecting terminal S, where the first input terminal IN0 of the multiplexer 206 receives the input signal S1. The level detecting unit 202 is coupled to the selecting terminal S of the multiplexer 206 and the input signal S1. The inverter 204 is coupled between the second input terminal IN1 and the input signal S1. The detecting unit 102 is capable of detecting the voltage level of the input signal. When the voltage level of the input signal S1 is detected to be kept at the logic high level for more than the preset time, the first input terminal IN0 of the multiplexer 206 is selected as the output, and the input signal S1 is directly output to the decoding unit 104 to perform the decoding process. When the voltage level of the input signal S1 is detected to be kept at the logic low level for more than the preset time, the second input terminal IN1 of the multiplexer 206 is selected as the output, and the inverted input signal S1 is output to the decoding unit 104 to perform the decoding process.

Figure 3:
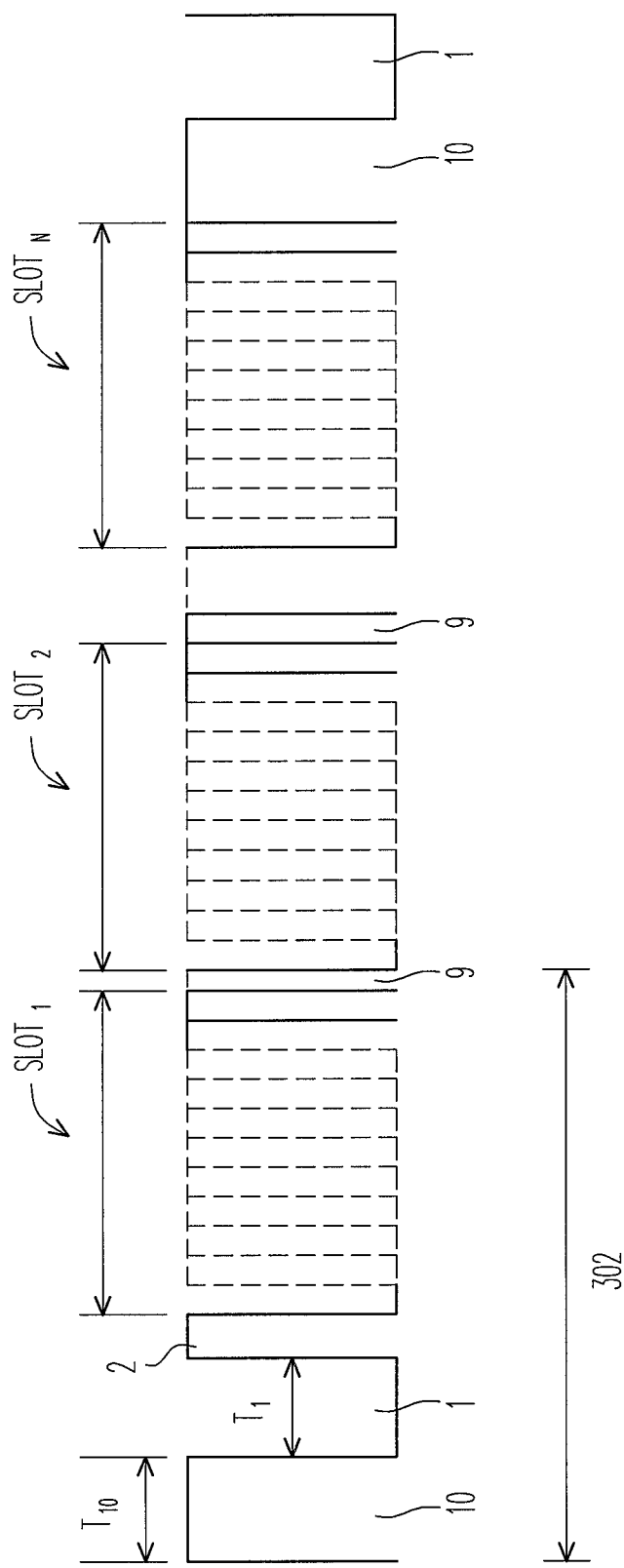
FIG. 3. is a waveform schematic diagram of an input signal according to a first embodiment of the invention.

Furthermore, the waveform of the input signal S1 is described below referring to FIG. 3. FIG. 3 is a waveform schematic diagram of an input signal according to a first embodiment of the invention. In the waveform of the input signal S1, the start of each data starts from a break 1, followed by a mark 2 and a plurality of time slots $SLOT_1$-$SLOT_n$, and there is a mark 10 (also referred to as a "MARK" Before Break, abbreviated as MBB) right after the last time slot $SLOT_n$, where n is a positive integer and $1 \leq n \leq 512$. The mark 10 is followed by the break 1 of the next data, and then further followed by the next data packet. Therefore, whether the input signal S1 is the inverted DMX512 signal can be determined by detecting the voltage level of the mark 10 located before the break 1. When the level detecting unit 202 detects the input signal to be kept at a specific logic level for more than the time length of the break 1, this means that this specific logic level should be the mark 10. If the input signal S1 is an in-phase DMX 512 signal, the mark 10 should be a logic high level. On the contrary, if the input signal S1 is an inverted phase DMX 512 signal, the mark 10 should be a logic low level. By doing so, the level detecting unit 202 may detect whether the input signal S1 is an inverted phase DMX512 signal so as to select a channel of the multiplexer 206.

It is to be noted that, FIG. 3 is just an exemplary waveform of the present embodiment but the invention is not limited thereto. The invention can be applied to various DMX512 signal format, such as a 2 times frequency DMX512 signal format or a four times frequency DMX512 signal format. Regarding the format of the DMX512, the description in the DMX512 specification can be referred to, so they are not described herein.

Moreover, the time length of the break may be different according to the actual situation. As illustrated in FIG. 3, the time length $T_1$ of the break 1 is normally between 88 μs and 176 μs, and the configuration of the preset time is required to be the maximum time length of the break during the actual operation. For example, during the actual operation, the maximum time length of the break is 176μ, then the level detecting unit 202 may determine the input signal S1 to be an in-phase signal or the inverted signal when the keeping time (i.e., the time length $T_{10}$ of the mark 10) of the specific logic level is over 176 μs. Then, the input signal S1 is adjusted to be the in-phase signal to perform the decoding process.

The level detecting unit 202 is capable of determining whether the input signal S1 is a in-phase signal or an inverted phase signal, and the inverter 204 and the multiplexer 206 are utilized to output the input signal S1 with in-phase, or to invert the input signal S1 with inverted phase through the inverter 204 and then to output the inverted input signal S1 to the decoding unit 104 so that the input signal S1 received by the decoding unit 104 can be ensured as the in-phase signal, so as to avoid the situation where the decoding circuit 100 is unable to decode the input signal S1 correctly.

Second Embodiment

Figure 4:
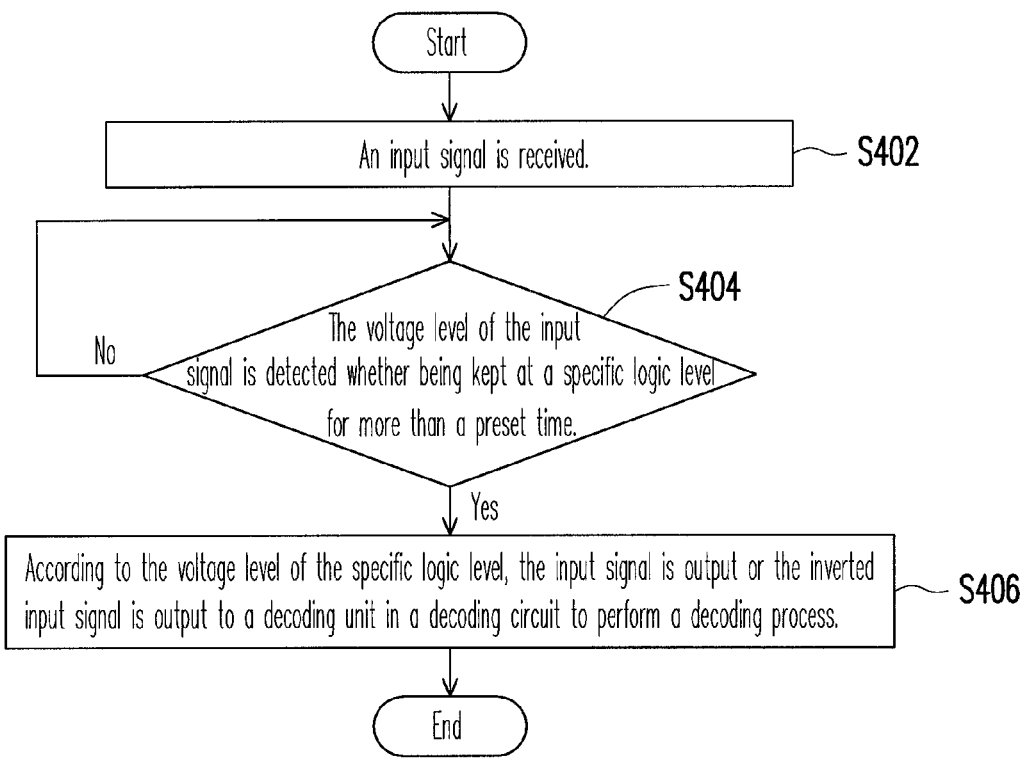
FIG. 4 is a flowchart of a decoding method according to a second embodiment of the invention.

FIG. 4 is a flowchart of a decoding method according to a second embodiment of the invention. Referring to FIG. 4, the decoding method of the decoding circuit 100 can be summarized as the following steps: firstly, an input signal is received (step S402). Next, the input signal is detected whether being kept at a specific logic level for more than a preset time (step S404). Finally, if the input signal is kept at the specific logic level for more than the preset time, according to the voltage level of the specific logic level, the input signal or the inverted input signal is output to the decoding unit 104 in the decoding circuit 100 to perform the decoding process (step S406). Accordingly, the decoding circuit 100 can be ensured to decode the driving data correctly so as to produce the expected display effects.

Figure 5:
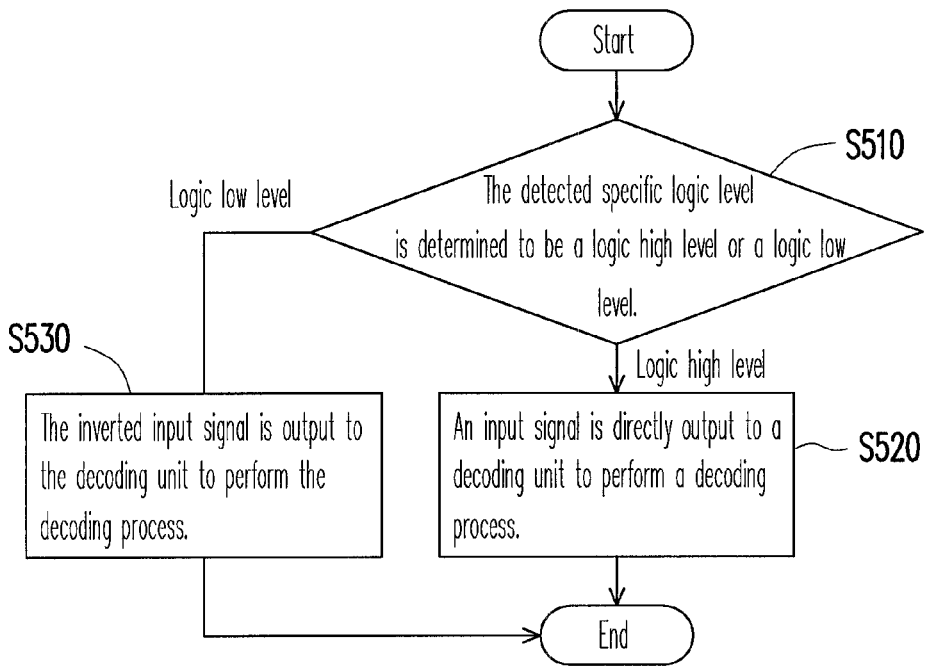
FIG. 5 is a flowchart of a decoding method according to a second embodiment of the invention.

To be more specific, the aforementioned step S406 can be represented by FIG. 5, and FIG. 5 is a flowchart of a decoding method according to a second embodiment of the invention. Referring to FIG. 5, the detected specific logic level is firstly determined to be the logic high level or the logic low level (step S510). When the specific logic level is the logic high level, the input signal is directly output to the decoding unit to perform the decoding process (step S520); when the specific logic level is the logic low level, the inverted input signal is output to the decoding unit to perform the decoding process (step S530). The operation details of the decoding method can be referred to the descriptions of FIG. 1-FIG. 3, so they are not described herein.

In summary, the invention utilizes the detecting unit to detect the logic level of the input signal to be high or low, and the keeping time of the logic level so as to determine whether the input signal is the inverted signal, and then adjust the received input signal to the in-phase signal format according to the determination result. Accordingly, no matter the input signal is the in-phase signal or the inverted signal, the decoding circuit is able to receive the input signal of the in-phase, and correctly decode the input signal, thereby drive the LED to produce the expected illumination effects.

Although the invention has been disclosed above by the exemplary embodiments, they are not intended to limit the invention. Anybody skilled in the art can make some modifications and variations without departing from the spirit and scope of the invention. Therefore, the protecting range of the invention falls in the appended claims.

What is claimed is:

1. A decoding circuit, adapted for decoding an input signal, wherein the input signal corresponds to a DMX512 signal format, the input signal comprises at least a break, and the length of the break is a preset time, the decoding circuit comprising:
   a decoding unit; and
   a detecting unit, coupled to the decoding unit, configured for detecting whether the input signal is kept at a specific logic level for more than the preset time;
   wherein, when the input signal is kept at the specific logic level for more than the preset time, the detecting unit, according to the voltage level of the specific logic level, determines to output the input signal or the inverted input signal to the decoding unit to perform a decoding process.

2. The decoding circuit as claimed in claim 1, wherein,
   when the specific logic level is at a logic high level, the detecting unit outputs the received input signal to the decoding unit; and
   when the specific logic level is at a logic low level, the detecting unit outputs the inverted input signal to the decoding unit.

3. The decoding circuit as claimed in claim 1, wherein the detecting unit comprising:
   a multiplexer, having a first input terminal, a second input terminal and a selecting terminal, wherein the first input terminal received the input signal;
   a inverter, coupled between the second input terminal and the input signal, configured for inverting the input signal and outputting the inverted input signal to the second input terminal; and
   a level detecting unit, coupled to the selector terminal of the multiplexer and the input signal, configured for detecting whether the input signal is kept at the specific logic level for more than the preset time, and controlling the multiplexer according to the voltage level of the specific logic level so as to make the multiplexer to output the input signal or the inverted input signal.

4. The decoding circuit as claimed in claim 3, wherein,
   when the specific logic level is at a logic high level, the multiplexer outputs the received input signal to the decoding unit; and
   when the specific logic level is at a logic low level, the multiplexer outputs the inverted input signal to the decoding unit.

5. The decoding circuit as claimed in claim 3, wherein the decoding unit is a DMX512 decoder.

6. The decoding circuit as claimed in claim 1, wherein the detecting unit detects whether a mark located before the break is over the preset time.

7. A decoding method, adapted for a decoding circuit to decode an input signal, wherein the input signal corresponds to a DMX512 signal format, the input signal comprises at least a break, and the length of the break is a preset time, the decoding method comprising:

receiving the input signal; and detecting whether the input signal is kept at a specific logic level for more than the preset time;

wherein, when the input signal is kept at the specific logic level for more than the preset time, outputting the input signal or the inverted input signal to a decoding unit in the decoding circuit to perform a decoding process according to the voltage level of the specific logic level.

8. The decoding method as claimed in claim 7, wherein, when the specific logic level is at a logic high level, the received input signal is output to the decoding unit; and when the specific logic level is at a logic low level, the inverted input signal is output to the decoding unit.

9. The decoding method as claimed in claim 7, wherein the decoding unit is a DMX512 decoder.

10. The decoding method as claimed in claim 7, wherein the step of detecting whether the input signal is kept at the specific logic level for more than the preset time further comprises:

detecting whether a mark located before the break is over the preset time.

11. The decoding method as claimed in claim 7, wherein the decoding circuit is integrated in a LED driver chip.

* * * * *